United States Patent
Hepner et al.

(10) Patent No.: US 7,516,393 B2
(45) Date of Patent: Apr. 7, 2009

(54) SYSTEM AND METHOD OF ERROR DETECTION FOR UNORDERED DATA DELIVERY

(75) Inventors: David F. Hepner, San Jose, CA (US); Andrew D. Walls, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 467 days.

(21) Appl. No.: 11/069,777

(22) Filed: Mar. 1, 2005

(65) Prior Publication Data

US 2006/0200731 A1 Sep. 7, 2006

(51) Int. Cl.
*H03M 13/00* (2006.01)

(52) U.S. Cl. .................................. 714/776

(58) Field of Classification Search ............. 714/766, 714/785, 781, 808, 757, 799, 800
See application file for complete search history.

(56) References Cited

U.S. PATENT DOCUMENTS

| | | | |
|---|---|---|---|
| 5,271,000 A | | 12/1993 | Engbersen et al. |
| 5,410,546 A | | 4/1995 | Boyer et al. |
| 5,779,013 A | * | 7/1998 | Bansbach ............... 192/21.5 |
| 5,951,707 A | * | 9/1999 | Christensen et al. ....... 714/752 |
| 6,223,320 B1 | * | 4/2001 | Dubey et al. ............. 714/757 |
| 6,961,893 B1 | * | 11/2005 | Mukund et al. ........... 714/781 |
| 6,964,008 B1 | * | 11/2005 | Van Meter, III ........... 714/807 |
| 7,039,656 B1 | * | 5/2006 | Tsai et al. ............... 707/201 |
| 7,174,498 B2 | * | 2/2007 | Weissinger .............. 714/785 |
| 2003/0066011 A1 | * | 4/2003 | Oren .................... 714/758 |

OTHER PUBLICATIONS

"*Automatic Correction of Burst Errors in Variable Length Serial by Bit Messages*", Https://www.delphion.com/tdbs/tdb?o=64C%2000105; Feb. 1964, IBM Technical Disclosure Bulletin, pp. 25-26.

* cited by examiner

*Primary Examiner*—Esaw T Abraham
*Assistant Examiner*—Sam Rizk
(74) *Attorney, Agent, or Firm*—Kinzler & McKenzie

(57) ABSTRACT

A system and method of error detection for unordered data delivery. A data set is received, the data set including a plurality of data segments, each having a descriptor; a data packet for each of the plurality of data segments, each of the data packets including the data segment and the descriptor for each of the plurality of data segments; and a source cyclic redundancy check (CRC) code for each of the data packets. The source CRC codes are stored as a source CRC table and a received CRC code is computed for a first data packet. It is determined whether the received CRC code for the first data packet is in the source CRC table and the first data packet is used when the received CRC code for the first data packet is in the source CRC table.

13 Claims, 2 Drawing Sheets

SYSTEM AND METHOD OF ERROR DETECTION FOR UNORDERED DATA DELIVERY

FIELD OF INVENTION

The present invention relates generally to data transmission, and particularly, to an error detection method for unordered data delivery.

BACKGROUND OF THE INVENTION

When data is moved across a transmission link from a sending node to a receiving node, such as over Fibre Channel, Ethernet, PCIX bus, PCI Express, iSCSI, or the like, the data is broken into data packets sized to accommodate the buffer size of the receiving node. The order in which the packets are received at the receiving node is sometimes different from the order in which the data packets are sent from the sending node. This unordering of the data can occur for many reasons: the two nodes may be part of a large fabric with many routers and switches in between, so that not every packet traverses the transmission link in the same way. Also, the sending node may elect to send the packets starting in the middle of the block of data rather than beginning. Unordering of the data creates problems in verifying data integrity.

Presently, each data packet includes a data segment of the desired size and a descriptor which indicates the location of the data segment within the data. An error protection code, such as a cyclic redundancy check (CRC) code, is calculated for the data packet at the sending node and transmitted to the receiving node with the data packet. At the receiving node, a received CRC code is calculated and compared to the transmitted CRC code. The data segment of the data packet is moved to a buffer location as designated by the descriptor if the received and the transmitted CRC codes are equal.

A buffer CRC code is calculated as the data segments are moved to the buffer location. Because the CRC code calculation depends on the order of the data processed, the buffer CRC code depends on the order in which the data packets are received an their data segments moved to the buffer location. A process CRC code calculated as the re-ordered data is moved sequentially from the buffer for processing is not equal to the buffer CRC code. Therefore, the process CRC code cannot be compared to the buffer CRC code to verify the integrity of the re-ordered data.

It would be desirable to have an error detection method for unordered data delivery that would overcome the above disadvantages.

SUMMARY OF THE INVENTION

The present invention is a system and method of error detection for unordered data delivery. Source cyclic redundancy check (CRC) codes are calculated for source data packets at the sending node and stored in a source CRC table at the receiving node. The source data packets are received in any order, i.e., unordered, as received data packets at the receiving node. Received cyclic redundancy check (CRC) codes are calculated for received data packets and checked against the source CRC table to detect errors in the received data packets.

One aspect of the present invention provides a method to detect errors at a receiving node. A data set is received, the data set including a plurality of data segments, each having a descriptor; a data packet for each of the plurality of data segments, each of the data packets including the data segment and the descriptor for each of the plurality of data segments; and a source cyclic redundancy check (CRC) code for each of the data packets. The source CRC codes are stored as a source CRC table and a received CRC code is computed for a first data packet. It is determined whether the received CRC code for the first data packet is in the source CRC table and the first data packet is used when the received CRC code for the first data packet is in the source CRC table.

The foregoing and other features and advantages of the invention will become further apparent from the following detailed description of the presently preferred embodiments, read in conjunction with the accompanying drawings. The detailed description and drawings are merely illustrative of the invention, rather than limiting the scope of the invention being defined by the appended claims and equivalents thereof.

DESCRIPTION OF PRESENTLY PREFERRED EMBODIMENTS

Figure 1:
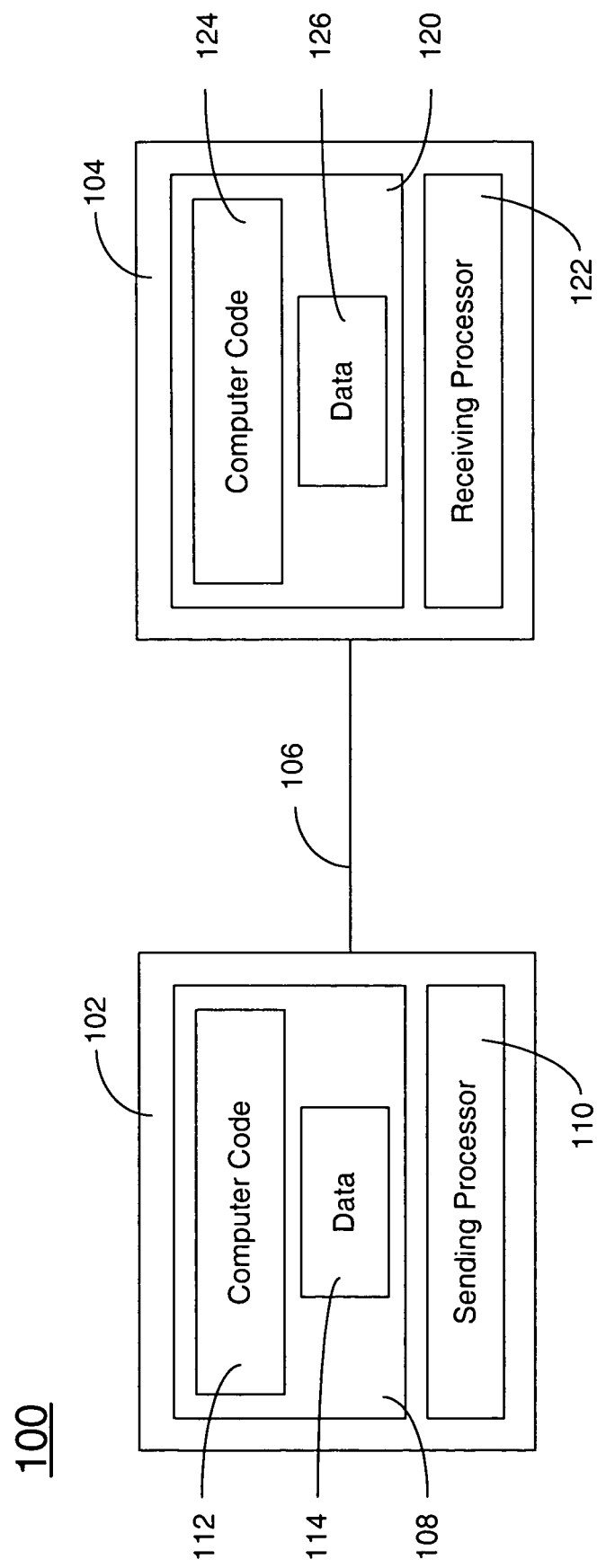
FIG. 1 is a block diagram of a system using an error detection method for unordered data delivery in accordance with the present invention.

FIG. 1 is a block diagram of a system using an error detection method for unordered data delivery. The system 100 includes a sending node 102 and a receiving node 104 operably connected by a transmission link 106. One example is a sending node and a receiving node operably connected over a Fibre Channel link.

The sending node 102 includes sending storage 108 and sending processor 110. The sending storage 108 stores computer code 112 and data 114. The sending processor 110 is responsive to the computer code 112 to move, store, and perform calculations with the data 114. The sending processor 110 divides a source data set of the data 114 into data segments with an associated descriptor, assemble the data segments and associated descriptors into source data packets, calculates a source cyclic redundancy check (CRC) code for each of the source data packets, and directs transmission of each of source data packets and the associated source CRC code over the transmission link 106.

The transmission link 106 is any transmission link over which data can be sent, such as an on-board bus or the Internet. Examples of transmission links include Fibre Channel, Ethernet, PCIX bus, PCI Express, iSCSI, and the like. The transmission link 106 can include a number of parallel paths and/or intermediate nodes so that data packets arrive at the receiving node as received data packets in a different order than the order in which the data packets are sent from the sending node as source data packets.

The receiving node 104 includes receiving storage 120 and receiving processor 122. The receiving storage 120 stores computer code 124 and data 126. The receiving processor 122 is responsive to the computer code 124 to move, store, and perform calculations with the data 126. The receiving processor 122 directs reception of the received data packets and the associated source CRC code from the transmission link 106, stores the source CRC codes as a source CRC table, calculates a received CRC code for one of the received data packets, determines whether the received CRC code is in the source CRC table, and uses the received data packet when its received CRC code is in the source CRC table. The receiving processor 122 can also error correct the received data packet when its received CRC code is not in the source CRC table or use the received data packet by storing its data segment in the receiving storage 120 in an order specified by its data sequence identifier.

Figure 2:
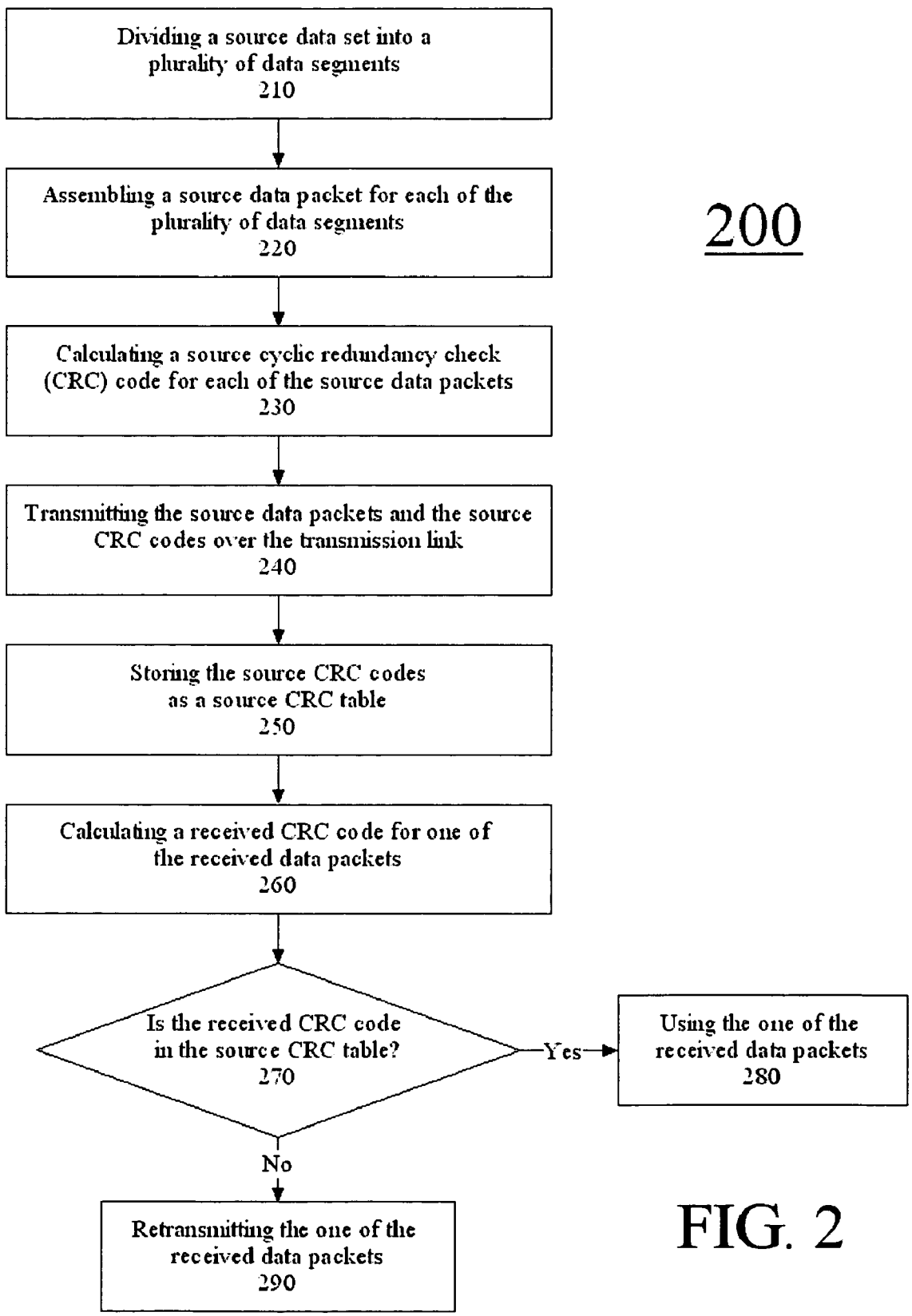
FIG. 2 is a flow chart of an error detection method for unordered data delivery in accordance with the present invention.

FIG. 2 is a flow chart of an error detection method for unordered data delivery. The method 200 includes dividing a source data set into a plurality of data segments, each of the plurality of data segments having a descriptor 210; assembling a source data packet for each of the plurality of data segments, each of the source data packets including the data segment and the descriptor for each of the plurality of data segments 220; calculating a source cyclic redundancy check (CRC) code for each of the source data packets 230; transmitting each of source data packets and the source CRC code for each of the source data packets over the transmission link, the source data packets becoming received data packets 240; storing the source CRC codes at the receiving node as a source CRC table 250; calculating a received CRC code for one of the received data packets 260; determining whether the received CRC code for the one of the received data packets is in the source CRC table 270; and using the one of the received data packets when the received CRC code for the one of the received data packets is in the source CRC table 280. In one embodiment, the method includes retransmitting the one of the received data packets when the received CRC code for the one of the received data packets is not in the source CRC table 290. The receiving node can then signal the transmission operation as complete. In an alternative embodiment, the method includes error correcting the one of the received data packets when the received CRC code for the one of the received data packets is not in the source CRC table, using an error correcting code such as a Reed Solomon code.

The source data set is any data set to be transmitted over a transmission link from a sending node to a receiving node. The source data set is divided into a plurality of data segments 210 for transmission due to the size of the source data set, for increased security, or for any other reason desired. Overly large packets can tie up the transmission link making the transmission link unavailable for other nodes needing to use the transmission link. In addition, overly large packets require large intervening buffers, which are typically fast and expensive hardware such as static random access memory (SRAM) or part of an application-specific integrated circuit (ASIC). The size of the data segments can be of equal or of different sizes. In one embodiment, the source data set is divided into a plurality of data segments 210 due to the limited size of buffers in the receiving node.

To prepare the data for transmission over the transmission link, a source data packet is assembled from each of the data segments and its associated descriptor 220. The descriptor includes at least a data sequence identifier, which identifies the relative location of the particular data segment within the source data set. The data sequence identifier can be used to re-assemble the data segments into the data set at the receiving node. In an alternative embodiment, the descriptor includes a data size identifier, which identifies the size of the particular data segment. The data size identifier can be used to efficiently store the data segments at the receiving node. In yet another alternative embodiment, the descriptor includes additional information, such as packet routing.

A data size identifier is optional when the data packets are of equal size, i.e., when the data segments are of equal size. In one embodiment, the data packet size is fixed for all source data sets and the fixed data packet size stored at the receiving node. In an alternative embodiment, the data packet size varies with each source data set and the data packet size transmitted over the transmission link to the receiving node before the source data packets are transmitted.

A source cyclic redundancy check (CRC) code for each of the source data packets is calculated 230 according to methods well known to those skilled in the art. The CRC calculation treats the binary data in the data packet as factors of a message polynomial, which is divided by a generator polynomial with constant coefficients. The remainder of the division is the CRC code. In one embodiment, the CRC codes for all of the source data packets are calculated before any of the source data packets are transmitted. In an alternative embodiment, one or more of the source data packets are transmitted before the CRC codes for all the source data packets are calculated, so that the CRC code calculation and the source data packet transmission are carried on simultaneously or alternately. Simple parity codes are commutative and the vertical parity result, i.e., the result when each group of data (like a 4 byte word) is EXCLUSIVE ORed, is the same regardless of the processing order. One example is a Reed Solomon code, which is a block-based error correcting code.

In one embodiment, the generator polynomial is:

$$X^{32}+X^{26}+X^{23}+X^{22}+X^{16}+X^{12}+X^{11}+X^{10}+X^8+X^7+X^5+X^4+X^2+X+1.$$

The coefficient of $X^0$ (i.e., 1) is stored in the least significant bit of the 32 bit word and the coefficient of $X^{32}$ is stored in the most significant bit. The CRC code is appended to the data with the most significant byte first. The seed (initial value) for generating the CRC code can be any non-zero value known to the generator and checker of the data.

Each of source data packets and the source CRC code for each of the source data packets are transmitted over the transmission link from the sending node to the receiving node, and the source data packets become received data packets 240. Typically, the source data packet is transmitted with its associated source CRC code. In an alternative embodiment, the source data packet and associated source CRC code are transmitted independently with an identifier to reference one to the other. In another embodiment, the source CRC codes are assembled into a CRC table and the CRC table transmitted as a block.

The transmission link is any transmission link over which data can be sent, such as an on-board bus or the Internet. Examples of transmission links include Fibre Channel, Ethernet, PCIX bus, PCI Express, iSCSI, and the like. The transmission link can include a number of parallel paths and/or intermediate nodes so that data packets arrive at the receiving node as received data packets in a different order than the order in which the data packets are sent from the sending node as source data packets. The change from source data packets to received data packets reflects that errors can occur during transmission, so that the source data packet can differ from the received data packet.

At the receiving node, the source CRC codes are stored as a source CRC table 250. The source CRC table can be stored in a contiguous memory block or interspersed with the received data packets. In one example, a sending node transmits 64 kilobytes of data across a transmission link to a receiving node. The transmission is structured as 2 kilobyte source data packets with each source data packet followed by an associated 4 byte source CRC code. To store the source CRC table in a contiguous memory block, the 64 kilobytes of data is stored in one memory block and the 128 bytes of source CRC codes (32 source CRC codes*4 bytes per source CRC code) is stored in another memory block as the source CRC table. Pointers can be used to associate a particular source data packet with a particular source CRC code, if desired. To store the source CRC table interspersed with the received data packets, each 2 kilobyte received data packet is stored in a memory location adjacent to its associated 4 byte source CRC code. Pointers can be used to identify the source CRC code memory locations as part of the source CRC table. The source CRC table interspersed with the received data packets occupies a memory block of 64 kilobytes of interspersed with 128 bytes of source CRC codes.

A received CRC code is calculated for one of the received data packets 260, using the same CRC code calculation method by which the source CRC code was calculated at the sending node. The received CRC code is compared to the source CRC table to determine whether the received CRC code is in the source CRC table 270. When the received CRC code is in the source CRC table, the associated received data packet is used 280. In one embodiment, the associated received data packet is used by storing its data segment in receiving storage of the receiving node in an order specified by its data sequence identifier. In one embodiment, the associated received data packet is error corrected when the received CRC code is not in the source CRC table.

The chance that a transmission error could produce a received CRC code which appears on the source CRC table is quite remote. The probability of aliasing, i.e., that a value in the source CRC table erroneously indicates accurate data transmission for one received data packet, is about $1/(232)$ for a 32 bit CRC code. If there are N data packets associated with a particular data set, the probability of aliasing is about $N/(232)$ for a 32 bit CRC code.

While the embodiments of the invention disclosed herein are presently considered to be preferred, various changes and modifications can be made without departing from the scope of the invention. The scope of the invention is indicated in the appended claims, and all changes that come within the meaning and range of equivalents are intended to be embraced therein.

We claim:

1. A method to detect errors at a receiving node comprising:
   receiving a data set comprising:
   a plurality of data segments, each of the plurality of data segments having a descriptor;
   a data packet for each of the plurality of data segments, each of the data packets including the data segment and the descriptor for each of the plurality of data segments, wherein a size of the data packet is 2 kilobytes and the descriptor comprises a data sequence identifier;
   a source cyclic redundancy check (CRC) code for each of the data packets, wherein a size of the CRC code is 4 bytes;
   storing each data packet in a 64 kilobyte memory block at a receiving node;
   storing the source CRC codes as a source CRC table in a 128 byte memory block at the receiving node;
   computing a received CRC code for a first data packet;
   determining whether the received CRC code for the first data packet is in the source CRC table; and
   using the first data packet when the received CRC code for the first data packet is in the source CRC table by storing the data segment of the first data packet in receiving storage in an order specified by the data sequence identifier of the first data packet.

2. The method of claim 1 further comprising retransmitting the first data packet when the received CRC code for the first data packet is not in the source CRC table.

3. The method of claim 1 further comprising error correcting the first data packet when the received CRC code for the first data packet is not in the source CRC table.

4. The method of claim 1 wherein the descriptor further comprises a data size identifier, and the storing the data segment of the first data packet in receiving storage further comprises storing the data segment of the first data packet in receiving storage in a location sized according to the data size identifier.

5. A system to detect errors at a receiving node comprising:
   a processor;
   a memory coupled to said processor to store instructions executable by a digital processing apparatus to perform operations to detect errors in received data, the operations comprising:
   receiving a data set comprising:
   a plurality of data segments, each of the plurality of data segments having a descriptor;
   a data packet for each of the plurality of data segments, each of the data packets including the data segment and the descriptor for each of the plurality of data segments, wherein a size of the data packet is 2 kilobytes and the descriptor comprises a data sequence identifier;
   a source cyclic redundancy check (CRC) code for each of the data packets, wherein a size of the CRC code is 4 bytes;
   storing each data packet in a 64 kilobyte memory block data receiving node;
   storing the source CRC codes as a source CRC table in a 128 byte memory block at the receiving node;
   computing a received CRC code for a first data packet;
   determining whether the received CRC code for the first data packet is in the source CRC table; and
   using the first data packet when the received CRC code for the first data packet is in the source CRC table by storing the data segment of the first data packet in receiving storage in an order specified by the data sequence identifier of the first data packet.

6. The system of claim 5, the operations further comprising retransmitting the first data packet when the received CRC code for the first data packet is not in the source CRC table.

7. The system of claim 5, the operations further comprising error correcting the first data packet when the received CRC code for the first data packet is not in the source CRC table.

8. The system of claim 5 wherein each of the data packets is of equal size and the operations further comprise receiving the size of the data packets.

9. A computer readable medium storing a computer program executable by a digital processing apparatus to perform operations to detect errors at a receiving node, the operations comprising:
   receiving a data set comprising:
   a plurality of data segments, each of the plurality of data segments having a descriptor;
   a data packet for each of the plurality of data segments, each of the data packets including the data segment and the descriptor for each of the plurality of data segments, wherein a size of the data packet is 2 kilobytes and the descriptor comprises a data sequence identifier;
   a source cyclic redundancy check (CRC) code for each of the data packets, wherein a size of the CRC code is 4 bytes;
   storing each data packet in a 64 kilobyte memory block data receiving node;
   storing the source CRC codes as a source CRC table in a 128 byte memory block at the receiving node;
   computing a received CRC code for a first data packet;

determining whether the received CRC code for the first data packet is in the source CRC table; and using the first data packet when the received CRC code for the first data packet is in the source CRC table by storing the data segment of the first data packet in receiving storage in an order specified by the data sequence identifier of the first data packet.

10. The computer readable medium of claim 9, the operations further comprising retransmitting the first data packet when the received CRC code for the first data packet is not in the source CRC table.

11. The computer readable medium of claim 9, the operations further comprising error correcting the first data packet when the received CRC code for the first data packet is not in the source CRC table.

12. The computer readable medium of claim 9 wherein each of the data packets is of equal size.

13. The computer readable medium of claim 9 wherein the storing the source CRC codes as a source CRC table comprises storing the source CRC codes interspersed with the data packets.

* * * * *